US010732518B2

(12) United States Patent
Awajikawa et al.

(10) Patent No.: US 10,732,518 B2
(45) Date of Patent: Aug. 4, 2020

(54) EXPOSURE METHOD, EXPOSURE APPARATUS, AND METHOD OF MANUFACTURING ARTICLE

(71) Applicant: CANON KABUSHIKI KAISHA, Tokyo (JP)

(72) Inventors: Tomonori Awajikawa, Utsunomiya (JP); Hayato Hoshino, Utsunomiya (JP); Norihiro Sakurakawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/420,369

(22) Filed: May 23, 2019

(65) Prior Publication Data
US 2019/0384186 A1 Dec. 19, 2019

(30) Foreign Application Priority Data
Jun. 15, 2018 (JP) ................. 2018-114691

(51) Int. Cl.
G03F 7/20 (2006.01)
(52) U.S. Cl.
CPC ...... *G03F 7/70775* (2013.01); *G03F 7/70716* (2013.01); *G03F 7/70725* (2013.01); *G03F 7/70758* (2013.01)
(58) Field of Classification Search
CPC ............. G03F 7/70716; G03F 7/70725; G03F 7/70758; G03F 7/70775; G03F 9/7007; G03F 9/7011; H01L 21/682
USPC ........................ 310/12.06; 355/52, 72, 75, 77
See application file for complete search history.

(56) References Cited

U.S. PATENT DOCUMENTS

| 2002/0039178 A1* | 4/2002 | Takeishi ................. G03B 27/42 355/53 |
| 2002/0109824 A1 | 8/2002 | Yamaguchi |
| 2005/0128460 A1* | 6/2005 | Van Den Biggelaar ..................... G03F 7/70508 355/72 |
| 2007/0182947 A1* | 8/2007 | Hempenius ............. G03F 7/707 355/75 |
| 2009/0073402 A1 | 3/2009 | Bijvoet |
| 2009/0086180 A1* | 4/2009 | Ottens ................. G03F 7/70725 355/53 |
| 2009/0147236 A1 | 6/2009 | De Vos |

(Continued)

FOREIGN PATENT DOCUMENTS

JP 2015231035 A 12/2015

OTHER PUBLICATIONS

Extended European Search Report issued in European Application No. 19176690.6 dated Oct. 29, 2019.

*Primary Examiner* — Colin W Kreutzer
(74) *Attorney, Agent, or Firm* — Rossi, Kimms & McDowell LLP

(57) ABSTRACT

The present invention provides an exposure method of exposing a substrate via an original held by a stage while scanning the original, comprising: performing a first step of scan-driving the stage so that a maximum acceleration becomes a first acceleration; and performing a second step of scan-driving the stage while exposing the substrate so that the maximum acceleration becomes a second acceleration after the performing the first step, wherein the first acceleration is lower than the second acceleration.

27 Claims, 11 Drawing Sheets

(56) References Cited

U.S. PATENT DOCUMENTS

2010/0102413 A1\* 4/2010 Bijvoet .................. G03B 27/58
                                                                257/499
2017/0131642 A1\* 5/2017 Baselmans .......... G03F 7/70641
2017/0285491 A1\* 10/2017 Takagi .................. G03F 9/7015

\* cited by examiner

EXPOSURE METHOD, EXPOSURE APPARATUS, AND METHOD OF MANUFACTURING ARTICLE

BACKGROUND OF THE INVENTION

Field of the Invention

The present invention relates to an exposure method, an exposure apparatus, and a method of manufacturing an article.

Description of the Related Art

As one type of apparatus used in the manufacturing step (lithography step) of a semiconductor device, a display (FPD), and the like, there is known an exposure apparatus that exposes (scans and exposes) a substrate while relatively scan-driving an original and the substrate and transfers the pattern of the original onto the substrate. In such exposure apparatus, since the holding state between the original and the substrate is incomplete, for example, immediately after a stage holds the original (or substrate), an inertia force acting on the original when driving the stage may cause a positional fluctuation (slide) of the original with respect to the stage. Japanese Patent Laid-Open No. 2015-231035 discloses a technique of executing preliminary driving of the stage at the maximum acceleration equal to that at the time of scanning exposure before scanning exposure of the substrate in order to fix the original onto the stage by improving the holding state between the original (reticle) and the stage.

For the exposure apparatus, an error between a position on the stage at which the original is fixed by driving the stage and a target position on the stage at which the original is to be arranged is desirably small.

SUMMARY OF THE INVENTION

The present invention provides, for example, a technique advantageous in fixing an original onto a stage.

According to one aspect of the present invention, there is provided an exposure method of exposing a substrate via an original held by a stage while scanning the original, comprising: performing a first step of scan-driving the stage so that a maximum acceleration becomes a first acceleration; and performing a second step of scan-driving the stage while exposing the substrate so that the maximum acceleration becomes a second acceleration after the performing the first step, wherein the first acceleration is lower than the second acceleration.

Further features of the present invention will become apparent from the following description of exemplary embodiments with reference to the attached drawings.

DESCRIPTION OF THE EMBODIMENTS

Figure 1:
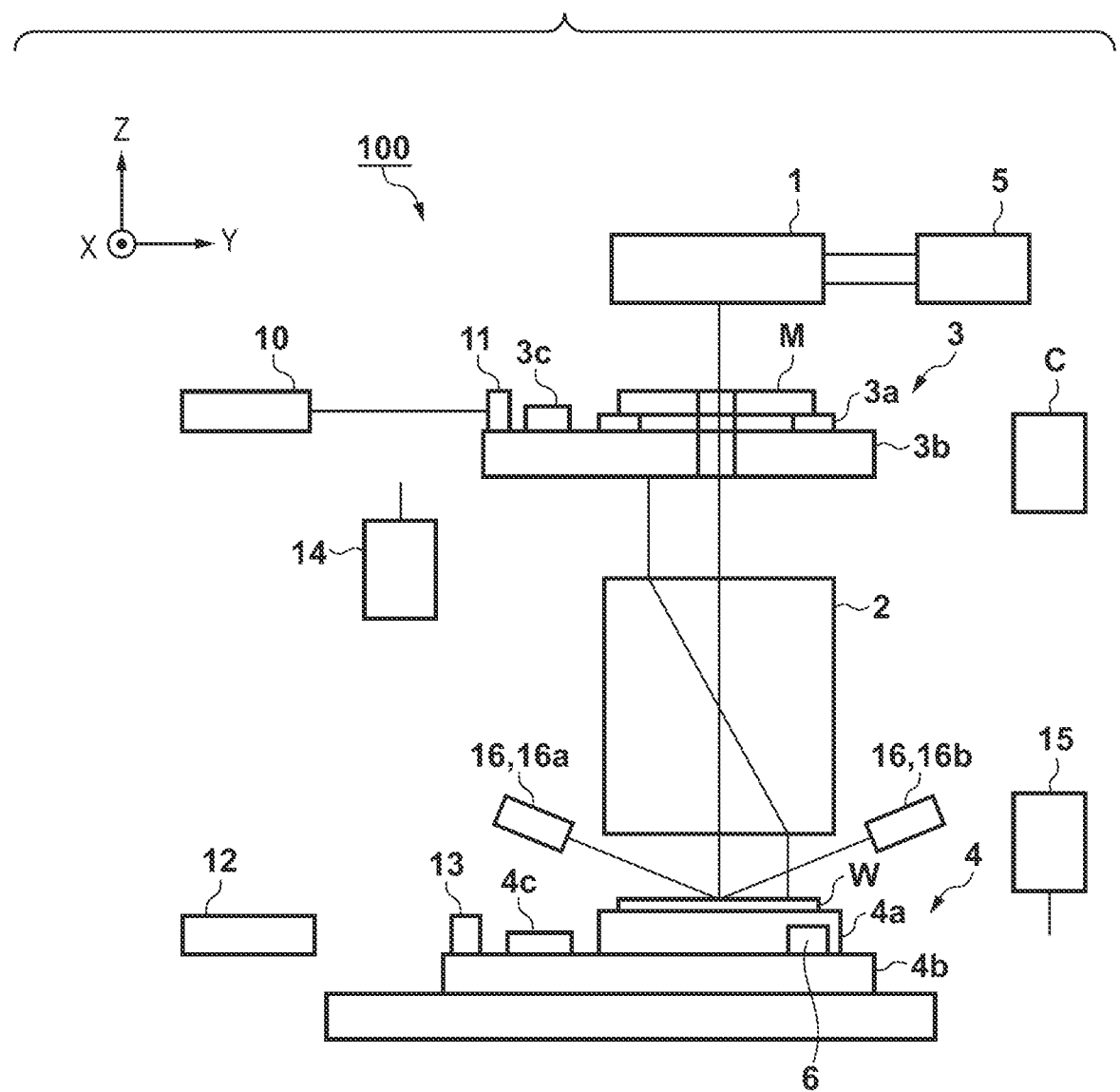
FIG. 1 is a view showing the arrangement of an exposure apparatus 100.

Exemplary embodiments of the present invention will be described below with reference to the accompanying drawings. Note that the same reference numerals denote the same members throughout the drawings, and a repetitive description thereof will not be given.

First Embodiment

The first embodiment according to the present invention will be described in detail with reference to the accompanying drawings. FIG. 1 is a view showing the arrangement of an exposure apparatus 100 according to this embodiment. The exposure apparatus 100 shown in FIG. 1 may be one of an exposure apparatus that exposes a substrate W (wafer) without intervention of a liquid between a projection optical system 2 and the substrate W, and a liquid-immersion exposure apparatus that exposes the substrate W with intervention of a liquid between the projection optical system 2 and the substrate W. An exposure apparatus that transfers a circuit pattern of a semiconductor device onto a substrate using an original M (reticle or mask) on which the circuit pattern is formed will be described below.

The exposure apparatus 100 shown in FIG. 1 is an exposure apparatus (scanning exposure apparatus) of a so-called scan-and-repeat method, that exposes the substrate W while relatively scan-driving the original M and the substrate W. The exposure apparatus 100 can include an illumination optical system 1, the projection optical system 2, an original stage 3 that can move while holding the original M, a substrate stage 4 that can move while holding the substrate W, and a control unit C. The control unit C is formed by, for example, a computer including a CPU and a memory (storage unit), and controls the respective units of the exposure apparatus 100. An XYZ orthogonal coordinate system shown in FIG. 1 can be defined so that a plane defined by the X and Y directions is parallel to the surface of the substrate W and the Z direction is perpendicular to the surface of the substrate W.

The illumination optical system 1 shapes light emitted from a light source 5 into, for example, band-like or arcuate light, and illuminates part of the original M with the shaped light. Although a KrF excimer laser that emits light having a wavelength of 248 nm can be used as the light source 5 but a mercury lamp, an ArF excimer laser (a wavelength of 193 nm), an EUV light source, or the like may be used. The projection optical system 2 has a predetermined projection magnification, and projects (forms an image), on the substrate, a pattern of the part of the original M illuminated by the illumination optical system 1.

The original stage 3 includes an original chuck 3a that holds the original M by, for example, vacuum chuck, electrostatic chuck, or the like, an original driving unit 3b that drives the original M in the X and Y directions together with the original chuck 3a, and a reference plate 3c on which a mark indicating the reference position of the original stage 3 is formed. The substrate stage 4 includes a substrate chuck 4a that holds the substrate W by, for example, vacuum chuck, electrostatic chuck, or the like, a substrate driving unit 4b that drives the substrate W in the X and Y directions together with the substrate chuck 4a, and a reference plate 4c on which a mark indicating the reference position of the substrate stage 4 is formed. The original stage 3 and the substrate stage 4 are arranged so that the original M and the substrate W are located at almost optically conjugate positions (the object plane and the image plane of the projection optical system 2) via the projection optical system 2.

The positions of the original stage 3 and the substrate stage 4 are measured by measurement units 10 and 12, respectively. The measurement unit 10 includes, for example, a laser interferometer, and can measure the position of the original stage 3 based on laser light reflected by a bar mirror 11 provided in the original stage 3 while emitting laser light to the bar mirror 11. Similarly, the measurement unit 12 includes, for example, a laser interferometer, and can measure the position of the substrate stage 4 based on laser light reflected by a bar mirror 13 provided in the substrate stage 4 while emitting laser light to the bar mirror 13.

The control unit C relatively scan-drives the original stage 3 and the substrate stage 4 at a speed ratio corresponding to the projection magnification of the projection optical system 2 in synchronism with each other based on the pieces of position information of the original stage 3 and the substrate stage 4 measured by the measurement units 10 and 12, respectively, during scanning exposure of the substrate W. This can transfer the pattern of the original M onto the substrate (more specifically, a resist on the substrate).

Figure 2:
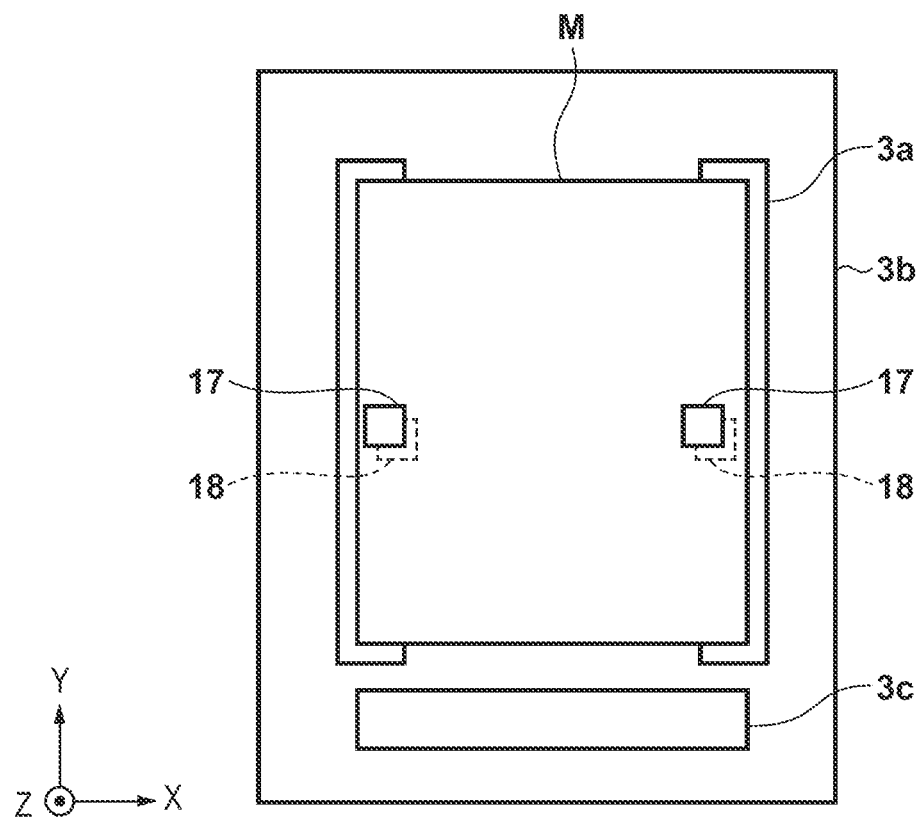
FIG. 2 is a view showing an original stage that holds an original when viewed from above.

The exposure apparatus 100 can further include an original position detection unit 14 (original alignment detection unit), a substrate position detection unit 15 (substrate alignment detection unit), and a surface position detection unit 16. The original position detection unit 14 includes an alignment scope that detects the mark of the original stage 3 and the mark of the original M that is arranged above the original position detection unit 14 by controlling the position of the original stage 3 by the control unit C, and obtains the relative position between the marks. For example, as shown in FIG. 2, a plurality of marks 18 separated in the X direction are provided on the original stage 3 (original chuck 3a), and the original position detection unit 14 detects each mark 17 of the original M and each mark 18 of the original stage 3. This can cause the original position detection unit 14 to obtain a positional deviation (X, Y, and θ directions) of the original M with respect to the original stage 3.

The substrate position detection unit 15 includes an alignment scope that detects a plurality of marks provided in sample shot regions among a plurality of shot regions in the substrate W, and obtains array information of the plurality of shot regions in the substrate W by performing statistical processing for detection results. The surface position detection unit 16 includes a projector 16a that projects light on the surface of the substrate W and an optical receiver 16b that receives light reflected by the surface of the substrate W, and detects the height (the position in the Z direction) of the surface of the substrate W. Referring to FIG. 1, each of the original position detection unit 14 and the substrate position detection unit 15 is formed as an off-axis detection unit that detects each mark without intervention of the projection optical system 2. The present invention, however, is not limited to this. For example, each unit may be formed as, for example, a TTL (Through The Lens) detection unit that detects each mark with intervention of the projection optical system 2.

Figure 3:
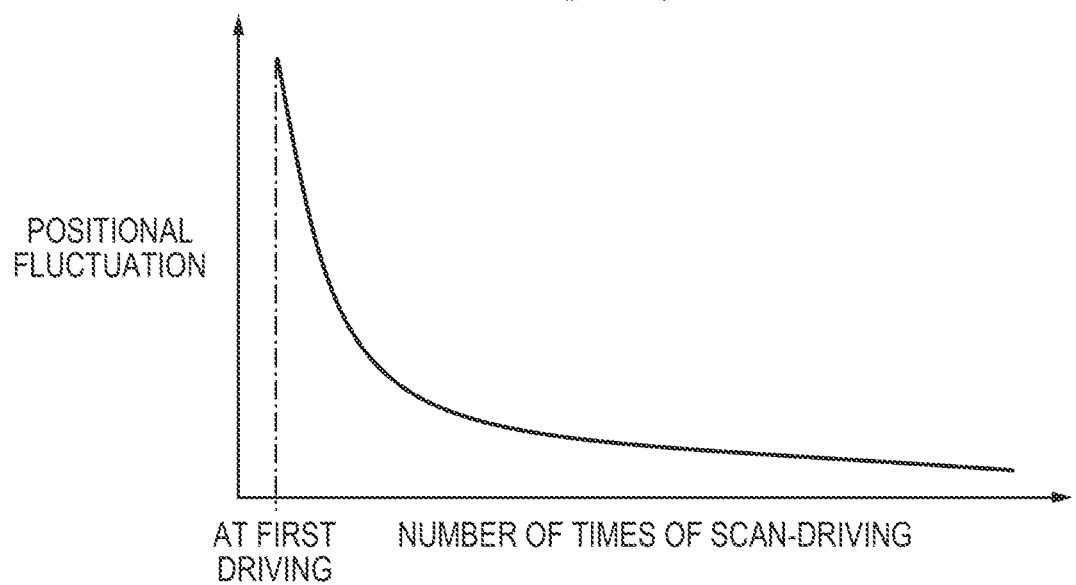
FIG. 3 is a graph showing the relationship between the number of times of scan-driving and a positional fluctuation of the original.

In the exposure apparatus 100, the original M is arranged at a target position (a position at which the original M is to be arranged) on the original stage 3 by an original conveyance unit (not shown), and the original stage 3 is made to hold the original M, thereby starting scanning exposure of the substrate W. However, immediately after the start of holding of the original M by the original stage 3, the holding state between the original stage 3 and the original M is incomplete. Thus, if the original stage 3 is driven in this state, an inertia force acting on the original M may cause a positional fluctuation (slide) of the original M on the original stage 3. That is, the relative position between the target position on the original stage 3 and the original M may vary due to scan-driving of the original stage 3. Such positional fluctuation of the original M occurs most easily in the first scan-driving of the original stage 3 after the start of holding of the original M, as shown in FIG. 3, and also tends to be large. On the other hand, if scan-driving of the original stage 3 is repeated, the holding state of the original M is improved to fix the original M to the original stage 3, thus reducing the positional fluctuation.

Figure 4:
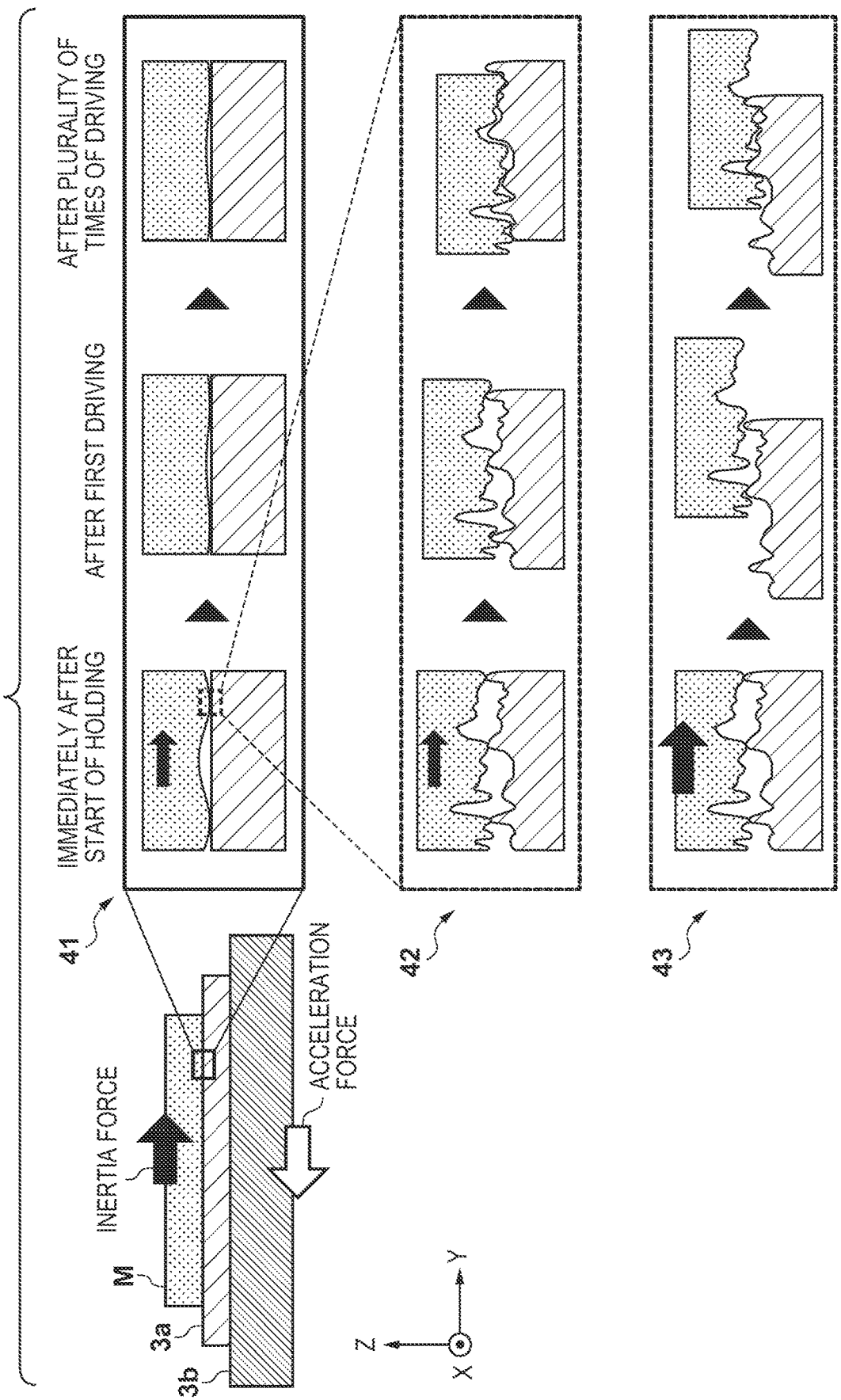
FIG. 4 is a view for explaining a principle of reducing the positional fluctuation of the original.

FIG. 4 is a view for explaining a principle of reducing the positional fluctuation of the original M by repeating scan-driving of the original stage 3. In FIG. 4, 41 shows an enlarged view of a boundary portion between the original stage 3 and the original M, and 42 and 43 each show an enlarged view of a micro region in 41 of FIG. 4. Furthermore, 42 of FIG. 4 shows a case in which the maximum acceleration when scan-driving the original stage 3 is low, and 43 of FIG. 4 shows a case in which the maximum acceleration when scan-driving the original stage 3 is high.

In 41 to 43 of FIG. 4, the left views (immediately after the start of holding) each show a state immediately after the original M is arranged at the target position on the original stage 3 and the original stage 3 starts to hold the original M. In this state, since the original M is supplied to the original stage 3 and held by the original stage 3 while the original M is deformed and distorted, so-called chuck distortion (vacuum distortion or adsorption distortion) occurs, and a number of regions (gaps) where the original M and the original stage 3 are not in contact with each other can exist microscopically. That is, this state is a state in which holding of the original M by the original stage 3 is unstable. On the other hand, if scan-driving of the original stage 3 is executed only once, an inertia force acts on the original M to largely reduce the chuck distortion, as shown in the central views (after the first driving) in 41 to 43 of FIG. 4, thereby making it possible to improve the holding state of the original M by the original stage 3. At this time, since the inertia force at the time of the high acceleration shown in 43 of FIG. 4 is larger than that at the time of the low acceleration shown in 42 of FIG. 4, the positional fluctuation tends to be large. If scan-driving of the original stage 3 is further executed, it is possible to fix the original M to the original stage 3, thereby further improving the holding state of the original M by the original stage 3, as shown in the right views (after a plurality of times of driving) in 41 to 43 of FIG. 4.

By repeating scan-driving of the original stage 3 in this way, the holding of the original M by the original stage 3 can be improved to fix the original M onto the original stage 3. Therefore, in general, the exposure apparatus executes "preliminary scan-driving" for fixing the original M onto the original stage 3 by scan-driving the original stage 3 without exposing the substrate W "Preliminary scan-driving" can be defined as driving the original stage 3 without stopping it with the same moving stroke (moving range) of the original stage 3 as that at the time of scanning exposure of the substrate W. Furthermore, "preliminary scan-driving" can be defined as executing scan-driving of the original stage 3 under the same conditions as those at the time of scanning exposure of the substrate W except for the acceleration of the original stage 3.

An error (to be sometimes referred to as a "positional deviation" hereinafter) between the target position on the original stage 3 and the position of the original M fixed onto the original stage 3 by preliminary scan-driving can be corrected by, for example, controlling the relative position between the original M and the substrate W during scanning exposure of the substrate W. However, the positional deviation is preferably small. For example, when arranging the mark of the original M above the original position detection unit 14, the control unit C drives the original stage 3 based on design information obtained by assuming that the original M is arranged at the target position on the original stage 3. However, if the acceleration becomes equal to or higher than a predetermined value with respect to the holding force of the original M by the original stage 3, the positional deviation increases suddenly. Therefore, if the positional deviation is too large, the mark of the original M does not fall within the detection field of the original position detection unit 14, and it may become difficult to position the original M. In this case, it takes time to search for the mark of the original M, which may be disadvantageous in terms of the throughput.

To cope with this, the exposure apparatus 100 according to this embodiment performs the first step of scan-driving the original stage 3 so that the maximum acceleration becomes the first acceleration, and the second step of scan-driving the original stage 3 while exposing the substrate W so that the maximum acceleration becomes the second acceleration. At this time, the first acceleration applied in the first step is made lower than the second acceleration applied in the second step. This can reduce the error (positional deviation) between the target position and the fixed position of the original M on the original stage 3. The second acceleration is the maximum acceleration of the original stage 3 in a recipe preset to execute scanning exposure of the substrate W, and can be, for example, the maximum acceleration of the original stage 3 set so that the time taken for scanning exposure of one shot region is equal to or shorter than a desired value.

As shown in FIG. 3, the positional fluctuation of the original M on the original stage 3 tends to be large by the first scan-driving of the original stage 3 after the start of holding of the original M by the original stage 3. Thus, the first step preferably includes the first scan-driving of the original stage 3 after the start of holding of the original M. Note that "scan-driving of the original stage 3" used in the following description is defined as driving the original stage 3 in one direction with the same moving stroke as that at the time of scanning exposure of the substrate W.

Figure 5:
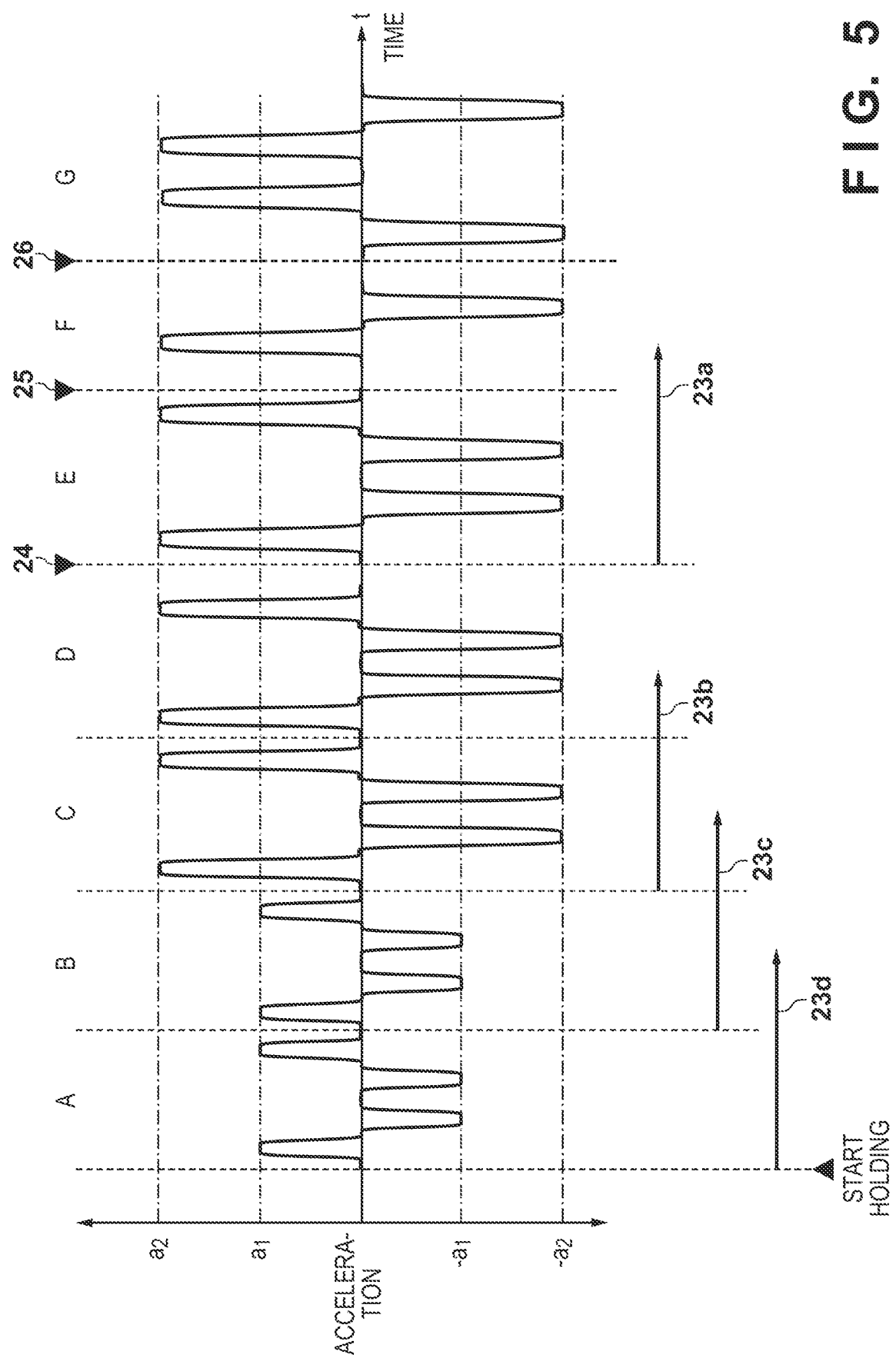
FIG. 5 is a timing chart showing an example of scan-driving of the original stage according to the first embodiment.
Figure 6:
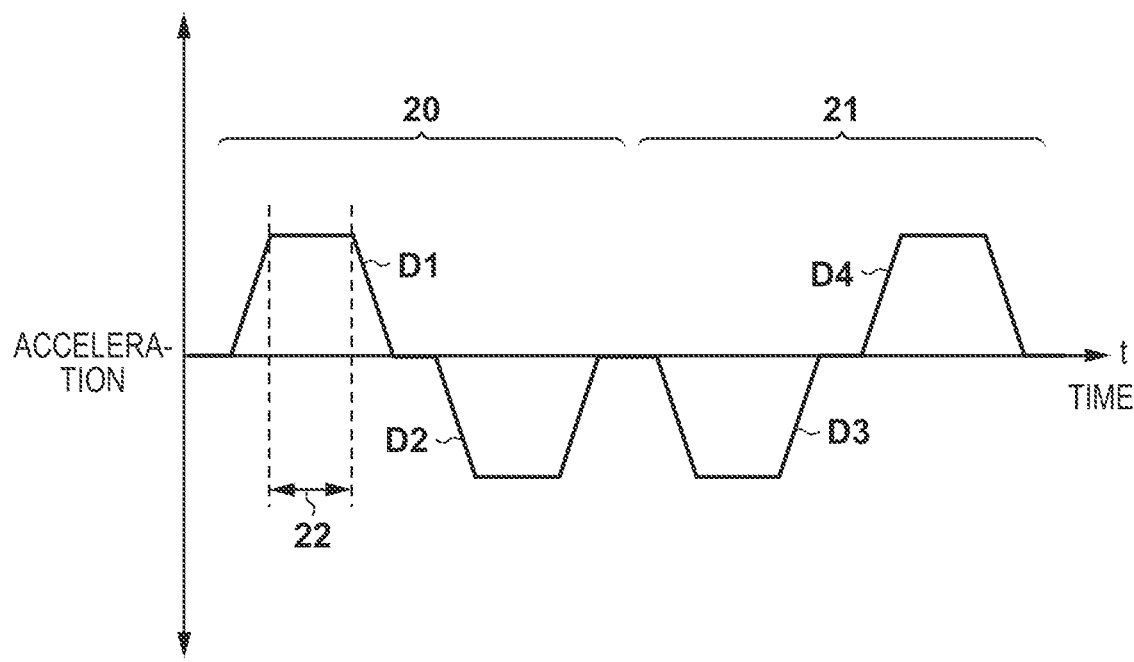
FIG. 6 is a timing chart showing the operation of the original stage in one driving step.

FIG. 5 is a timing chart showing an example of scan-driving of the original stage 3 in the exposure apparatus 100 according to this embodiment. In FIG. 5, the abscissa represents the time and the ordinate represents the acceleration of the original stage 3. Each of driving steps A to G shown in FIG. 5 includes reciprocal driving of the original stage 3 with the same moving stroke as that at the time of scanning exposure of the substrate W. More specifically, as shown in FIG. 6, one driving step includes scan-driving 20 of the original stage 3 in a predetermined direction (for example, +Y direction) and scan-driving 21 of the original stage 3 in the opposite direction (for example, −Y direction) of the predetermined direction. The scan-driving 20 of the original stage 3 in the predetermined direction includes an acceleration operation D1 and a deceleration operation D2, and the scan-driving 21 of the original stage 3 in the opposite direction includes an acceleration operation D3 and a deceleration operation D4. With respect to each acceleration operation (each deceleration operation), a constant acceleration period 22 (constant deceleration period) is preferably provided in terms of the reproducibility of the positional fluctuation of the original M.

In the example shown in FIG. 5, after the start of holding of the original M, driving steps A and B of executing scan-driving of the original stage 3 are performed so that the maximum acceleration becomes a first acceleration $a_1$. After driving steps A and B, driving steps C to G of executing scan-driving of the original stage are performed so that the maximum acceleration becomes a second acceleration $a_2$. As described above, the first acceleration $a_1$ is set to a value lower than the second acceleration $a_2$.

In the example shown in FIG. 5, timings of starting scanning exposure of the substrate W are indicated by arrows 23a to 23d. If, for example, scanning exposure of the substrate starts from driving step E, as indicated by the arrow 23a, driving steps A and B in which the first acceleration $a_1$ is applied and driving steps C and D in which the second acceleration $a_2$ is applied correspond to preliminary scan-driving. Furthermore, if scanning exposure of the substrate W starts from driving step C, as indicated by the arrow 23b, driving steps A and B in which the first acceleration $a_1$ is applied correspond to preliminary scan-driving. Similarly, if scanning exposure of the substrate W starts from driving step B, as indicated by the arrow 23c, driving step A in which the first acceleration $a_1$ is applied corresponds to preliminary scan-driving. Scanning exposure of the substrate W may start from driving step A of executing the first scan-driving of the original stage 3 after the start of holding of the original M, as indicated by the arrow 23d. In this case, no preliminary scan-driving is executed but the first acceleration $a_1$ is applied in driving step A. Therefore, as compared with a case in which the second acceleration $a_2$ is applied, the positional fluctuation (slide) of the original M on the original stage 3 is small and the influence on the accuracy of transfer of the pattern onto the substrate is small.

Figure 7:
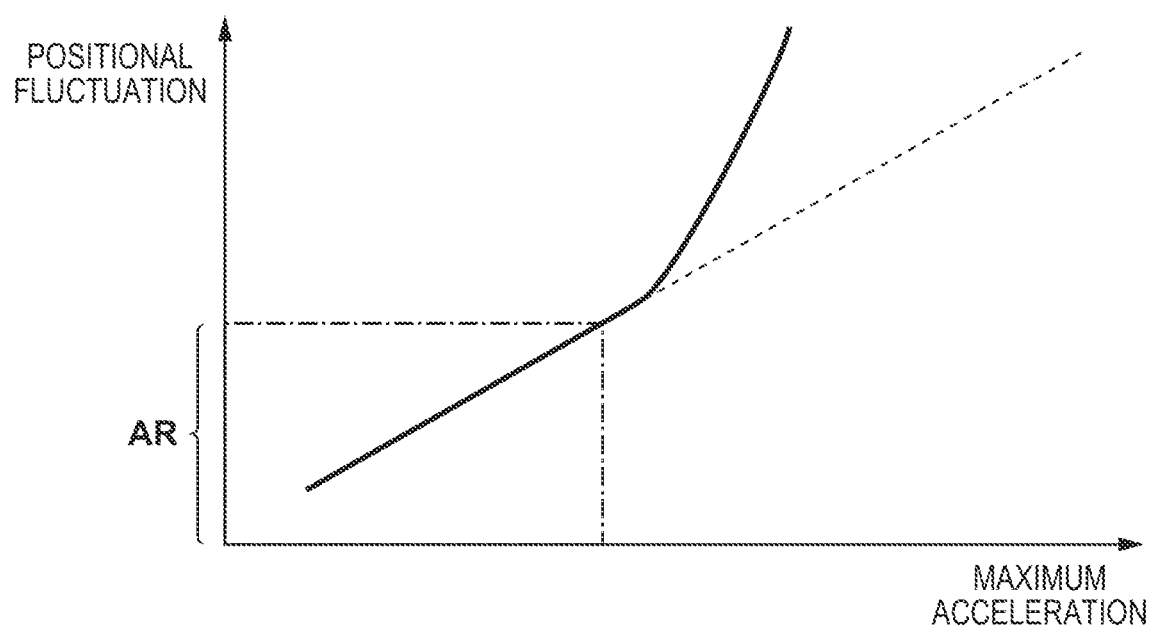
FIG. 7 is a graph showing the relationship between the positional fluctuation of the original and a maximum acceleration in the first scan-driving of the original stage.

Next, a method of setting the first acceleration will be described. The first acceleration can be set by the control unit C based on, for example, information representing the relationship between the positional fluctuation of the original M and the maximum acceleration in the first scan-driving of the original stage 3 after the start of holding of the original M. FIG. 7 is a graph showing the relationship (solid line) between the positional fluctuation of the original M and the maximum acceleration in the first scan-driving of the original stage 3. This relationship can be acquired by an experiment, simulation, or the like. For example, based on the information shown in FIG. 7, the first acceleration is preferably decided within the range of the maximum acceleration that allows the positional fluctuation of the original M on the original stage 3 to fall within an allowable range AR. The allowable range AR can be arbitrarily set based on the arrangement of the original stage 3 or the exposure apparatus itself, and may be input by the user via a user interface. The allowable range AR can be set to, for example, the dimensions (for example, the radius) of the detection field of the original position detection unit 14.

Figure 8:
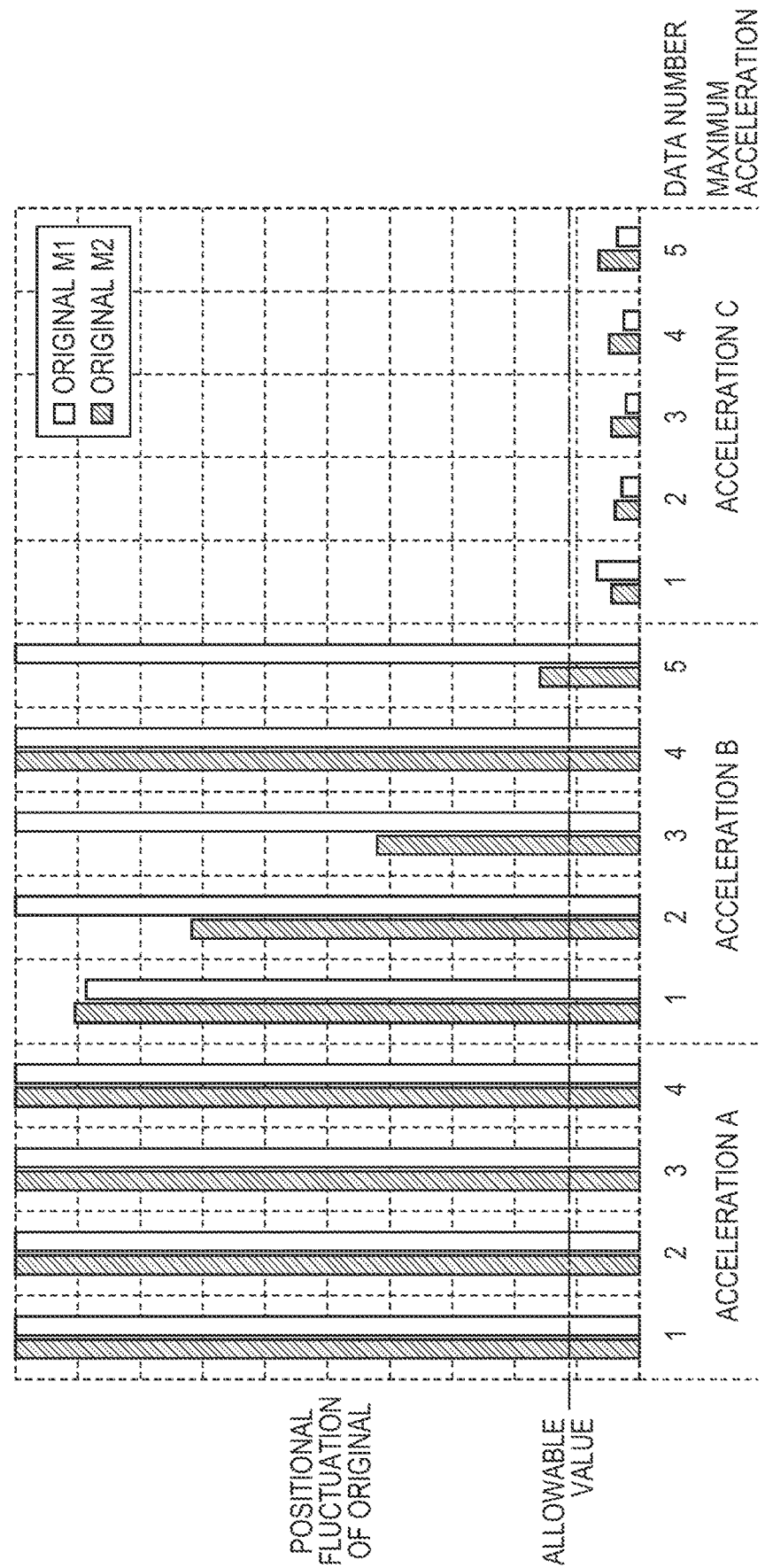
FIG. 8 is a view showing a result of experimenting the positional fluctuation of the original in the first scan-driving of the original stage while changing the maximum acceleration.

If the first acceleration is too low, the effect of reducing the chuck distortion is insufficient. If the first acceleration is too high, the positional fluctuation of the original M may become large. The first acceleration is preferably decided in consideration of the reproducibility of the positional fluctuation of the original M. FIG. 8 shows a result of experimenting the positional fluctuation of the original M in the first scan-driving of the original stage 3 while changing the maximum acceleration. FIG. 8 shows, with respect to each of different originals M1 and M2, the positional fluctuation of the original M at each of three accelerations A to C that can be candidates of the first accelerations. Each data is obtained by arranging the original on the original stage 3 and performing each step of scan-driving the original stage 3. As an example, acceleration A is set to 80% of the second acceleration (a value lower than the second acceleration by −1G), acceleration B is set to 60% of the second acceleration (a value lower than the second acceleration by −2G), and acceleration C is set to 40% of the second acceleration (a value lower than the second acceleration by −3G).

As shown in FIG. 8, it is understood that, at acceleration A, with respect to both the originals M1 and M2, the positional fluctuation of the original M largely exceeds an allowable value in each of data 1 to 4. At acceleration B, the positional fluctuation of the original M1 is almost the same as that at acceleration A, and largely exceeds the allowable value, and the positional fluctuation of the original M2 is reduced, as compared with acceleration A, but exceeds the allowable value. With respect to the original M2 at acceleration B, the positional fluctuations in data 1 to 5 largely vary, and are poor in reproducibility. On the other hand, at acceleration C, with respect to both the originals M1 and M2, the positional fluctuation of the original M is equal to or smaller than the allowable value in each of data 1 to 5, and is satisfactory in reproducibility. Therefore, based on the experimental result shown in FIG. 8, acceleration C is preferably set as the first acceleration. If the number of times of execution of scan-driving (first step) of the original stage at the first acceleration is too large, this is disadvantageous in terms of the throughput. On the other hand, if the number of times is too small, it is impossible to reduce the chuck distortion within the allowable range. The number of times of the first step is preferably set to, for example, four to 10 based on the experimental result.

Figure 9:
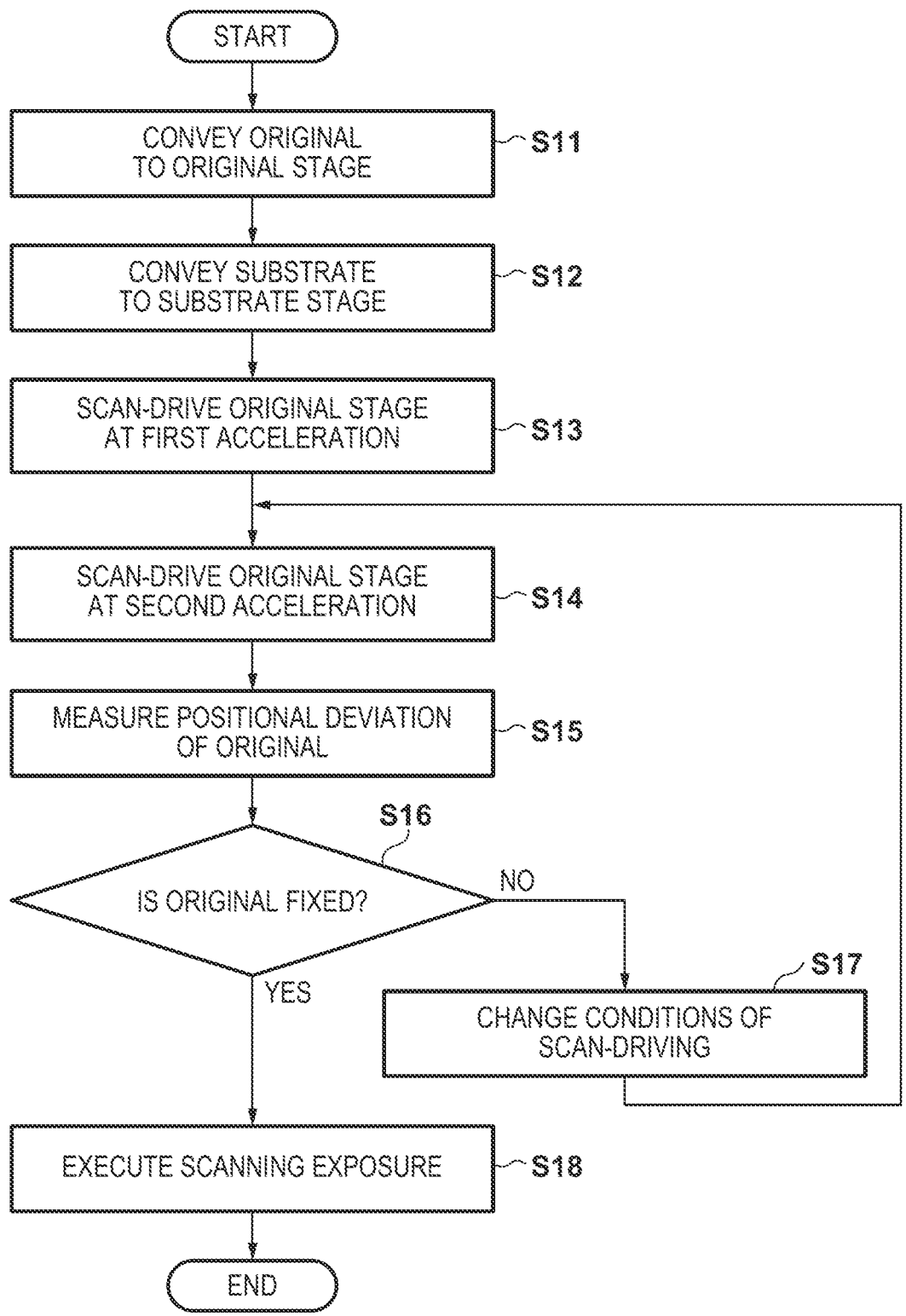
FIG. 9 is a flowchart illustrating the control procedure of the exposure apparatus according to the first embodiment.

The control procedure of the exposure apparatus 100 according to this embodiment will be described next. FIG. 9 is a flowchart illustrating the control procedure of the exposure apparatus 100 according to this embodiment. Each step of the control procedure shown in FIG. 9 can be performed by the control unit C. An example of executing, as preliminary scan-driving, scan-driving of the original stage 3 at the first acceleration and scan-driving of the original stage at the second acceleration will be described with reference to the control procedure shown in FIG. 9.

In step S11, the control unit C causes an original conveyance unit (not shown) to convey the original M to the target position on the original stage 3. In step S12, the control unit C causes a substrate conveyance unit (not shown) to convey the substrate W onto the substrate stage 4. In step S13, as preliminary scan-driving, the control unit C scan-drives the original stage 3 so that the maximum acceleration becomes the first acceleration (first step). In step S14, as preliminary scan-driving, the control unit C scan-drives the original stage 3 so that the maximum acceleration becomes the second acceleration (third step). In this embodiment, the second acceleration is applied in step S14. The present invention, however, is not limited to this, and the third acceleration that is higher than the first acceleration and lower than the second acceleration may be applied.

In step S15, the control unit C causes the original position detection unit 14 to measure the positional deviation (error) of the original M with respect to the target position on the original stage 3. More specifically, it is possible to measure the positional deviation when the control unit C can control the original stage 3 so that the mark of the original M and that of the original stage 3 are arranged above the original position detection unit 14, and cause the original position detection unit 14 to detect the relative position between the marks.

In step S16, the control unit C determines whether the original M is fixed onto the original stage 3, that is, whether the positional fluctuation of the original M on the original stage 3 falls (converges) within the allowable range. For example, the control unit C obtains the difference between the positional deviation of the original M currently measured in step S15 and that previously measured in step S15. If the difference falls within the allowable range, the control unit C determines that the original M is fixed onto the original stage 3. If it is determined that the original M is not fixed, the process advances to step S17 to change the conditions of preliminary scan-driving, and then steps S14 to S16 are performed again. On the other hand, if it is determined that the original M is fixed, the process advances to step S18. In step S18, the control unit C starts scanning exposure for each of the plurality of shot regions in the substrate W. In scanning exposure of each shot region, scan-driving of the original stage 3 is executed so that the maximum acceleration becomes the second acceleration (second step).

A detailed example of the control procedure shown in FIG. 9 will now be described. For example, as shown in FIG. 5, the positional deviation of the original M is measured at a measurement timing 24, reciprocal driving (two scan-driving operations) of the original stage 3 is executed, and then the positional deviation of the original M is measured at a measurement timing 25. The difference between the positional deviations measured at the measurement timings 24 and 25 is obtained, and it is determined whether the difference falls within the allowable range. If the difference falls outside the allowable range, it is determined that the original M is not fixed onto the original stage 3, and the conditions of preliminary scan-driving are changed to execute scan-driving of the original stage 3 again, thereby measuring the positional deviation of the original M at a measurement timing 26. If the difference between the positional deviations measured at the measurement timings 25 and 26 falls within the allowable range, it is determined that the original M is fixed onto the original stage 3, and scanning exposure of the substrate W is started. Examples of the conditions of preliminary scan-driving are the number of times of scan-driving of the original stage 3 and the maximum acceleration of the original stage 3. In the example shown in FIG. 5, as the conditions of preliminary scan-driving, the number of times of scan-driving of the original stage 3 is changed from two for reciprocal driving to one for one-way driving.

As described above, the exposure apparatus 100 according to this embodiment performs the first step of scan-driving the original stage 3 so that the maximum acceleration becomes the first acceleration, and the second step of scan-driving the original stage 3 while exposing the substrate W so that the maximum acceleration becomes the second acceleration. At this time, the first acceleration applied in the first step is made lower than the second acceleration applied in the second step. This can reduce the error (positional deviation) between the target position and the fixed position of the original M on the original stage 3.

Second Embodiment

The second embodiment according to the present invention will be described. In the second embodiment, as shown in FIG. 1, a detection unit 6 that detects the holding force of an original M by an original stage 3 (original chuck 3a) is provided, and the first step (scan-driving of the original stage 3 at the first acceleration) ends in accordance with a result of detecting the holding force of the original M by the detection unit 6. The holding force of the original M is, for example, a vacuum chuck pressure or electrostatic chuck pressure. Note that the arrangement of an exposure apparatus according to this embodiment is the same as in the first embodiment and a description thereof will be omitted.

Figure 10:
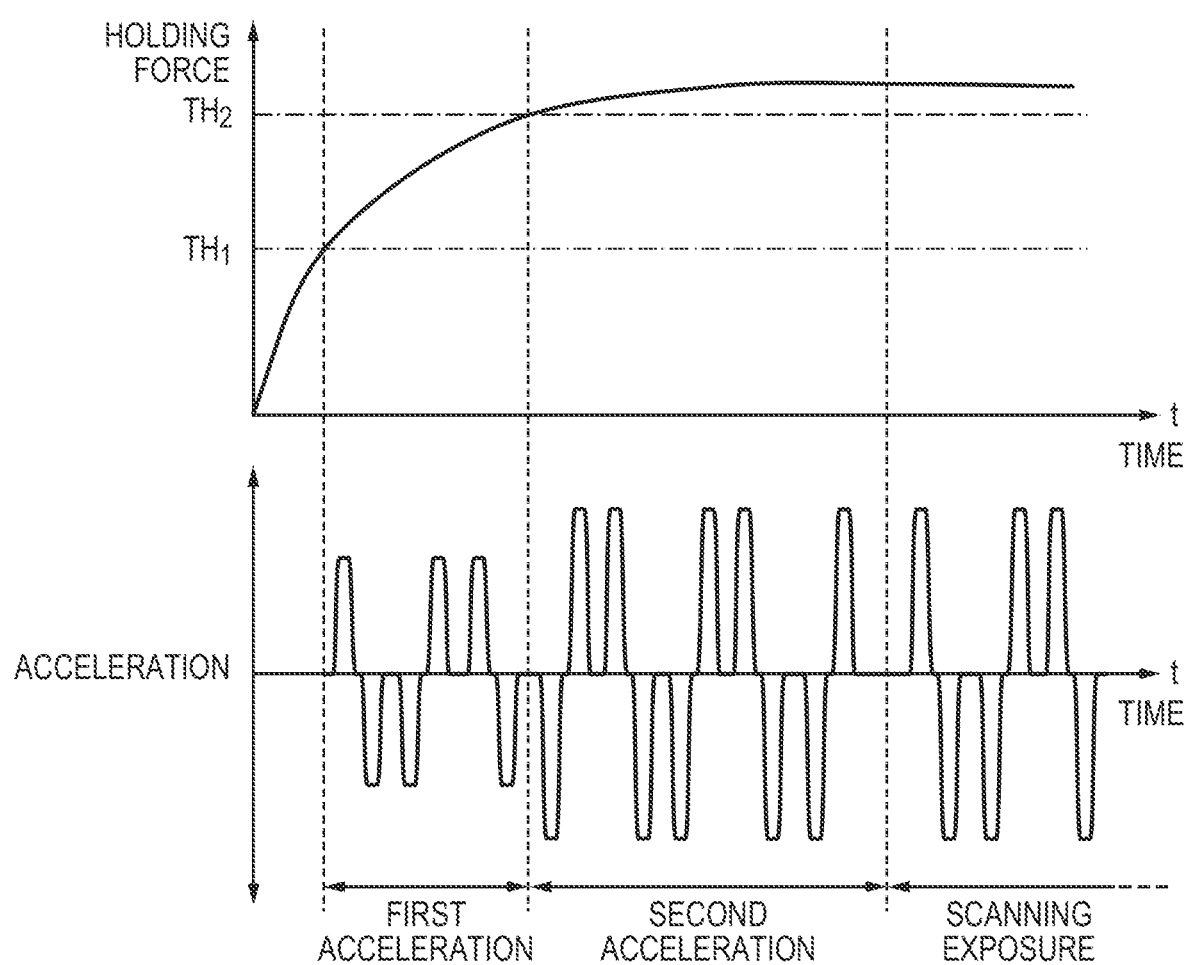
FIG. 10 shows timing charts of an example of scan-driving of an original stage according to the second embodiment.
Figure 11:
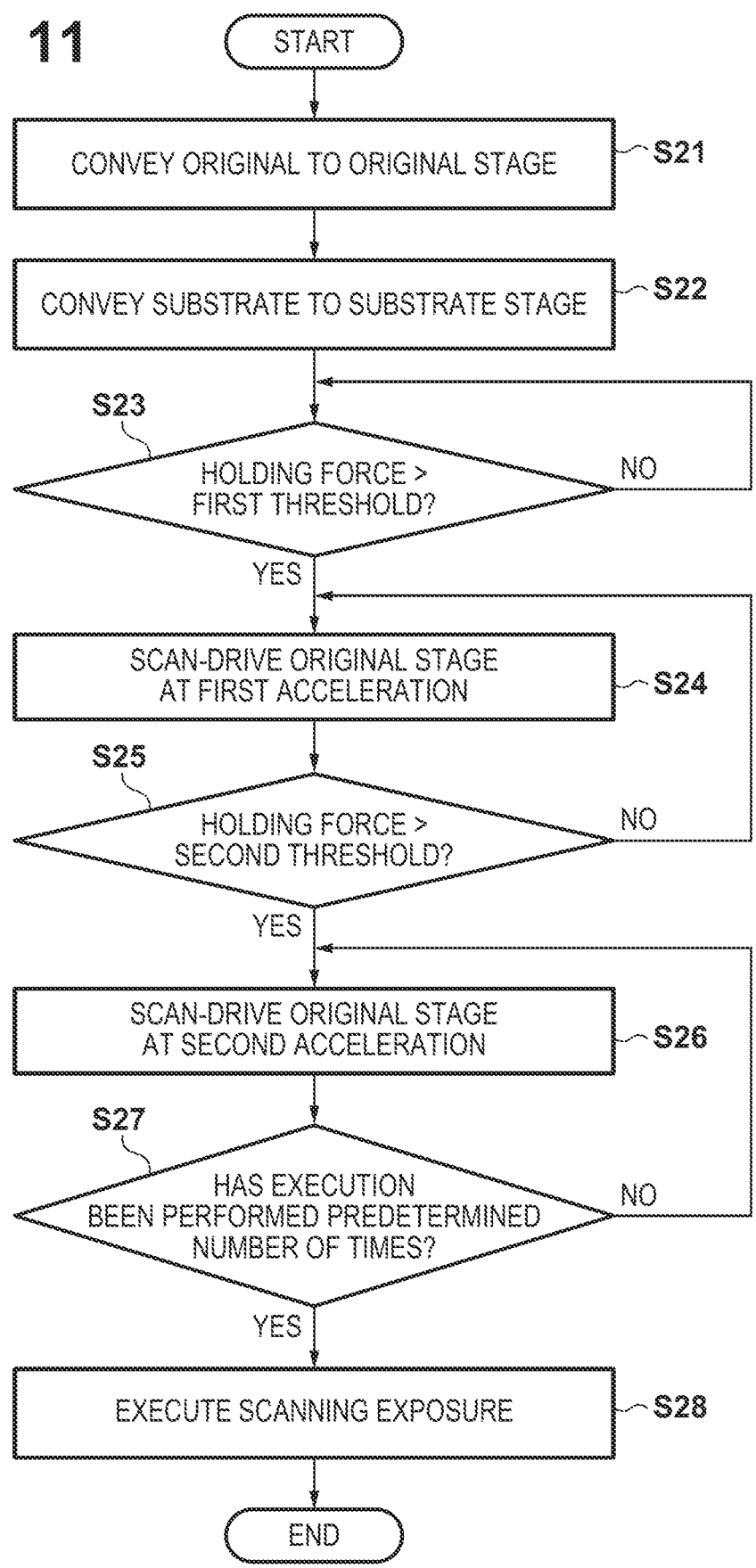
FIG. 11 is a flowchart illustrating the control procedure of an exposure apparatus according to the second embodiment.

The control procedure of the exposure apparatus according to this embodiment will be described with reference to FIGS. 10 and 11. FIG. 10 shows timing charts of a temporal change in holding force of the original M detected by the detection unit 6 and an example of scan-driving of the original stage 3. FIG. 11 is a flowchart illustrating the control procedure of the exposure apparatus according to this embodiment. Each step of the control procedure shown in FIG. 11 can be performed by a control unit C.

In step S21, the control unit C causes an original conveyance unit (not shown) to convey the original M to a target position on the original stage 3. In step S22, the control unit C causes a substrate conveyance unit (not shown) to convey a substrate W onto a substrate stage 4. In step S23, the control unit C determines whether the holding force of the original M detected by the detection unit 6 exceeds a first threshold $TH_1$. If the holding force of the original M does not exceed the first threshold TH1, step S23 is repeatedly performed; otherwise, the process advances to step S24. In step S24, the control unit C executes scan-driving (first step) of the original stage 3 so that the maximum acceleration becomes the first acceleration.

In an insufficient state in which the holding force of the original M by the original stage 3 is hardly generated, even if the relatively low first acceleration is applied to scan-driving of the original stage 3, the positional fluctuation (slide) of the original M on the original stage 3 may become large. To cope with this, in this embodiment, the first threshold $TH_1$ is provided, and scan-driving (first step) of the original stage 3 at the first acceleration starts when the holding force of the original M exceeds the first threshold $TH_1$. The holding force of the original M changes with a sharp gradient immediately after the start of holding of the original M but the gradient becomes gentle at a predetermined value. The first threshold $TH_1$ can be arbitrarily set but is preferably set to such change point of the gradient. For example, the first threshold $TH_1$ can be set to a value falling within a range of 40% to 60% of a value obtained when the holding force of the original M is in a steady state.

In step S25, the control unit C determines whether the holding force of the original M detected by the detection unit 6 exceeds a second threshold $TH_2$ larger than the first threshold $TH_1$. If the holding force of the original M does not exceed the second threshold $TH_2$, the process returns to step S24 to execute scan-driving of the original stage 3 at the first acceleration again. On the other hand, if the holding force of the original M exceeds the second threshold $TH_2$, the process advances to step S26 to end scan-driving of the original stage 3 at the first acceleration and execute scan-driving of the original stage 3 so that the maximum acceleration becomes the second acceleration. The second threshold $TH_2$ can be arbitrarily set but can be set to, for example, a value falling within a range of 80% to 95% of a value obtained when the holding force of the original M is in the steady state.

In step S27, the control unit C determines whether scan-driving of the original stage 3 at the second acceleration has been executed a predetermined number of times. If scan-driving of the original stage 3 at the second acceleration has not been executed the predetermined number of times, the process returns to step S26 to execute scan-driving of the original stage 3 at the second acceleration again. On the other hand, if scan-driving of the original stage 3 at the second acceleration has been executed the predetermined number of times, the process advances to step S28. In step S28, the control unit C starts scanning exposure for each of a plurality of shot regions in the substrate W. In scanning exposure of each shot region, scan-driving of the original stage 3 is executed so that the maximum acceleration becomes the second acceleration (second step).

As described above, in this embodiment, the maximum acceleration in scan-driving of the original stage 3 is changed in accordance with the holding force of the original M by the original stage 3. This can execute scan-driving of the original stage 3 at the maximum acceleration according to the holding force of the original M, and it is thus possible to prevent a positional fluctuation of the original M on the original stage 3 from occurring excessively. In this embodiment, the two thresholds for changing the maximum acceleration in scan-driving of the original stage 3 are set. However, three or more thresholds may be provided, and the maximum acceleration can be changed stepwise. The maximum acceleration may be changed continuously in accordance with the holding force of the original M.

Third Embodiment

The third embodiment according to the present invention will be described. In the third embodiment, the number of times of scan-driving of an original stage 3 is counted, and the first step (scan-driving of the original stage 3 at the first acceleration) ends in accordance with the counted number of times. Note that the arrangement of an exposure apparatus according to this embodiment is the same as in the first embodiment and a description thereof will be omitted.

Figure 12:
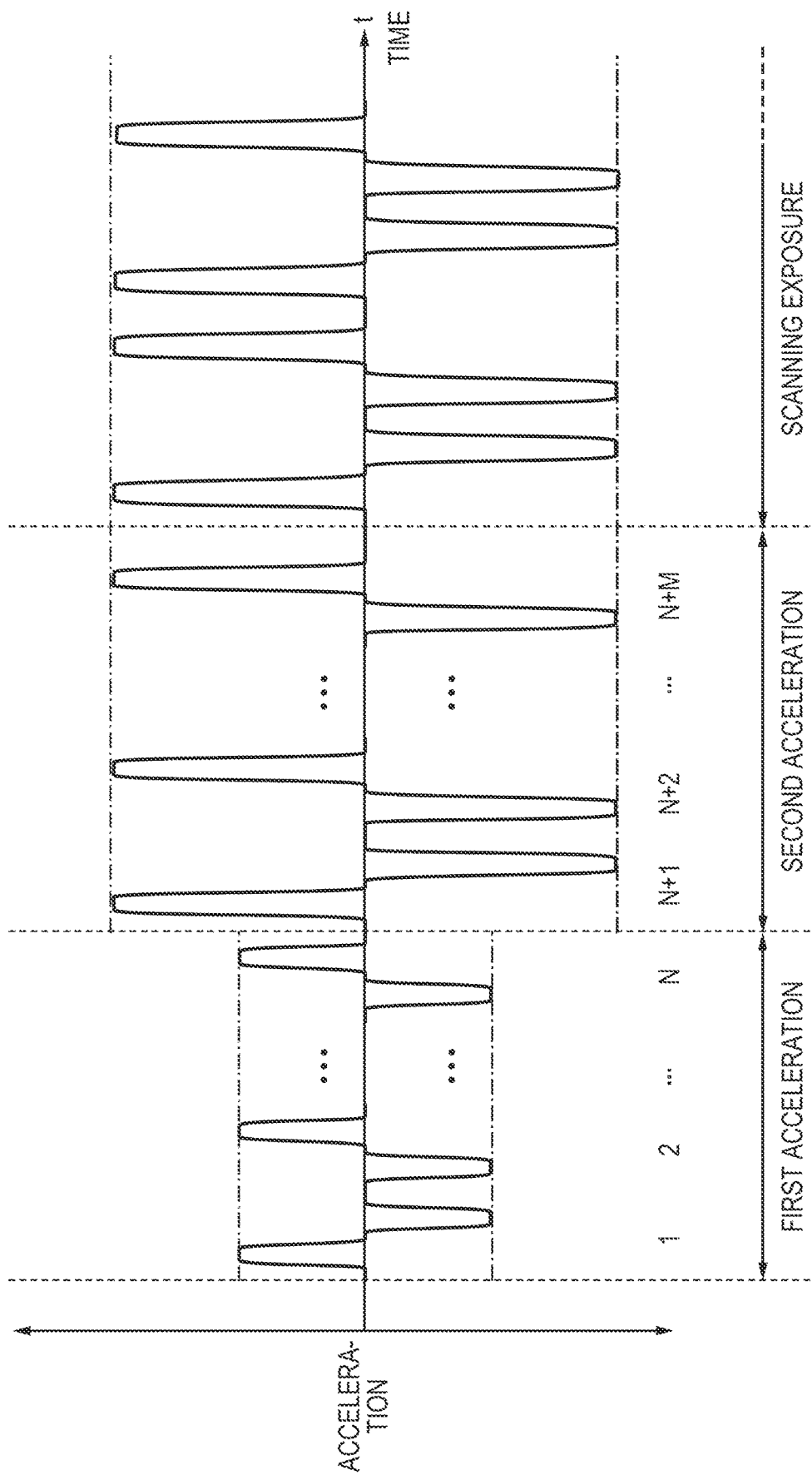
FIG. 12 is a timing chart showing an example of scan-driving of an original stage according to the third embodiment.
Figure 13:
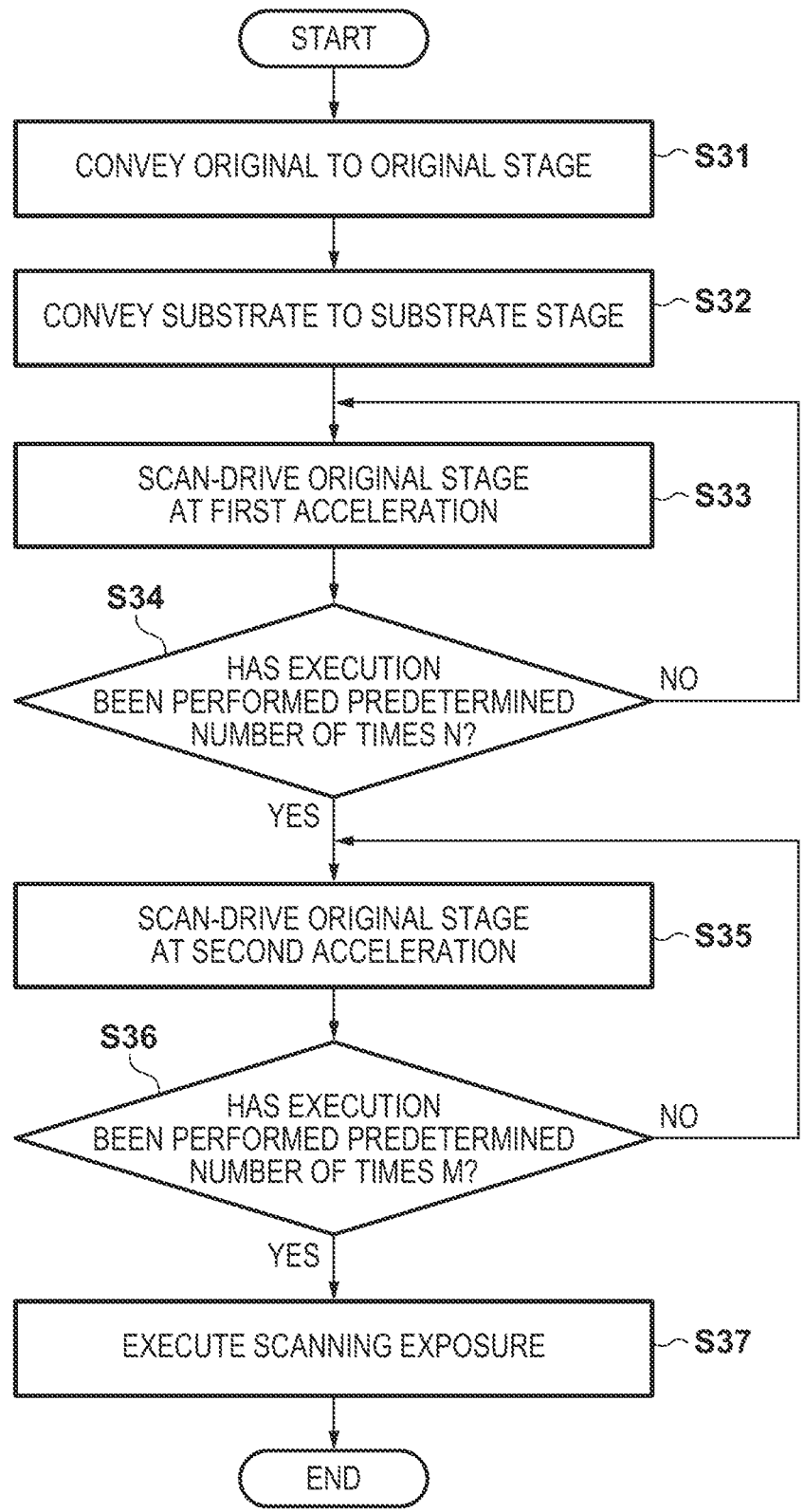
FIG. 13 is a flowchart illustrating the control procedure of an exposure apparatus according to the third embodiment.

The control procedure of the exposure apparatus according to this embodiment will be described with reference to FIGS. 12 and 13. FIG. 12 is a timing chart showing an example of scan-driving of the original stage 3. FIG. 13 is a flowchart illustrating the control procedure of the exposure apparatus according to this embodiment. Each step of the control procedure shown in FIG. 13 can be performed by a control unit C. Note that steps S31 and S32 are the same as steps S21 and S22 of the control procedure shown in FIG. 11 described in the second embodiment.

In step S33, the control unit C executes scan-driving (first step) of the original stage 3 so that the maximum acceleration becomes the first acceleration while counting the number of times of execution of scan-driving of the original stage 3 at the first acceleration. In step S34, the control unit C determines whether the number of times of execution of scan-driving of the original stage 3 at the first acceleration has reached a predetermined number N. Based on, for example, an experimental result, simulation, or the like, the predetermined number N can be set to a number such that a positional fluctuation of an original M caused by scan-driving of the original stage 3 falls within an allowable range. If the predetermined number N has not been reached, the process returns to step S34 to execute scan-driving of the original stage 3 at the first acceleration again; otherwise, scan-driving of the original stage 3 at the first acceleration ends, and the process advances to step S35.

In step S35, the control unit C executes scan-driving of the original stage 3 so that the maximum acceleration becomes the second acceleration while counting the number of times of execution of scan-driving of the original stage 3 at the second acceleration. In step S36, the control unit C determines whether the number of times of execution of scan-driving of the original stage 3 at the second acceleration has reached a predetermined number M. Based on, for example, an experimental result, simulation, or the like, the predetermined number M can be set to a number such that the positional fluctuation of the original M caused by scan-driving of the original stage 3 falls within the allowable range. If the predetermined number M has not been reached, the process returns to step S35 to execute scan-driving of the original stage 3 at the second acceleration again; otherwise, scan-driving of the original stage 3 at the second acceleration ends, and the process advances to step S37. In step S37, the control unit C starts scanning exposure for each of a plurality of shot regions in a substrate W. In scanning exposure of each shot region, scan-driving of the original stage 3 is executed so that the maximum acceleration becomes the second acceleration (second step).

As described above, in this embodiment, the maximum acceleration in scan-driving of the original stage 3 is changed in accordance with the number of times of execution of scan-driving of the original stage 3 at the first acceleration. In this control processing as well, it is possible to prevent a positional fluctuation of the original M on the original stage 3 from occurring excessively.

In this embodiment, the maximum acceleration is changed in accordance with the number of times of execution of scan-driving of the original stage 3. However, for example, the maximum acceleration may be changed in accordance with a time during which scan-driving of the original stage 3 is executed. More specifically, a time during which scan-driving of the original stage 3 at the first acceleration is executed is measured. When the time reaches the first threshold, scan-driving (first step) of the original stage 3 at the first acceleration ends, and scan-driving of the original stage 3 at the second acceleration starts. Then, a time during which scan-driving of the original stage 3 at the second acceleration is executed is measured. When the time reaches the second threshold, scan-driving of the original stage 3 at the second acceleration ends, and scanning exposure of the substrate starts.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming, using the above-described exposure apparatus, a latent image pattern on a photosensitive agent applied to a substrate (a step of exposing the substrate), and a step of developing (processing) the substrate with the latent image pattern formed in the above step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, quality, productivity, and production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-114691 filed on Jun. 15, 2018, which is hereby incorporated by reference herein in its entirety.

What is claimed is:

1. An exposure method of exposing a substrate via an original held by a stage while scanning the original, comprising:

performing a first step of scan-driving the stage without exposing the substrate so that a maximum acceleration is a first acceleration;

performing a second step of scan-driving the stage without exposing the substrate so that a maximum acceleration is a second acceleration, after the performing the first step; and performing a third step of scan-driving the stage while exposing the substrate, after the performing the second step, wherein the first acceleration is lower than the second acceleration, wherein scan-driving the stage in each of the first step and the second step includes an acceleration operation and a deceleration operation, the acceleration operation having a constant acceleration period in which an acceleration of the stage is constant, and the deceleration operation having a constant deceleration period in which an deceleration of the stage is constant, and wherein the number of times of scan-driving the stage in the first step is within a range from four times to ten times.

2. The method according to claim 1, wherein the first step includes first scan-driving of the stage after a start of holding of the original by the stage.

3. The method according to claim 1, wherein the first acceleration and the second acceleration are lower than a maximum acceleration for scan-driving the stage to be applied in the third step.

4. The method according to claim 1, further comprising determining, before the performing the third step, whether a positional fluctuation of the original on the stage caused by scan-driving of the stage falls within an allowable range,
   wherein in a case where it is determined that the positional fluctuation of the original falls within the allowable range, the performing the third step starts.

5. The method according to claim 4, wherein in a case where it is determined that the positional fluctuation of the original falls outside the allowable range, the maximum acceleration is changed, and the stage is scan-driven without exposing the substrate.

6. The method according to claim 1, wherein the performing the first step ends in accordance with a result of detecting a holding force of the original by the stage.

7. The method according to claim 6, wherein
   the performing the first step starts in a case where the result of detecting the holding force of the original exceeds a first threshold after a start of holding of the original by the stage, and
   the performing first step ends in a case where the result of detecting the holding force of the original exceeds a second threshold larger than the first threshold.

8. The method according to claim 1, wherein the performing the first step ends in accordance with the number of times of execution of scan-driving of the stage in the performing the first step.

9. The method according to claim 1, wherein the performing the first step ends in accordance with a time during which the performing the first step is executed.

10. The method according to claim 1, wherein in the performing the first step, the stage is scan-driven with the same moving stroke as in the performing the third step.

11. An exposure apparatus for exposing a substrate via an original while scanning the original, comprising:
   a stage configured to be movable while holding the original; and
   a control unit configured to control performing a first step of scan-driving the stage without exposing the substrate so that a maximum acceleration is a first acceleration, control performing a second step of scan-driving the stage without exposing the substrate so that a maximum acceleration is a second acceleration, and then control performing a third step of scan-driving the stage while exposing the substrate, wherein the first acceleration is lower than the second acceleration, wherein scan-driving the stage in each of the first step and the second step includes an acceleration operation and a deceleration operation, the acceleration operation having a constant acceleration period in which an acceleration of the stage is constant, and the deceleration operation having a constant deceleration period in which an deceleration of the stage is constant, and wherein the number of times of scan-driving the stage in the first step is within a range from four times to ten times.

12. A method of manufacturing an article, the method comprising:
   exposing a substrate using an exposure method;
   developing the exposed substrate; and
   processing the developed substrate to manufacture the article,
   wherein the exposure method exposes the substrate via an original held by a stage while scanning the original, and includes:
   performing a first step of scan-driving the stage without exposing the substrate so that a maximum acceleration is a first acceleration;
   performing a second step of scan-driving the stage without exposing the substrate so that a maximum acceleration is a second acceleration, after the performing the first step; and
   performing a third step of scan-driving the stage while exposing the substrate, after the performing the second step,
   wherein the first acceleration is lower than the second acceleration,
   wherein scan-driving the stage in each of the first step and the second step includes an acceleration operation and a deceleration operation, the acceleration operation having a constant acceleration period in which an acceleration of the stage is constant, and the deceleration operation having a constant deceleration period in which an deceleration of the stage is constant, and
   wherein the number of times of scan-driving the stage in the first step is within a range from four times to ten times.

13. The method according to claim 1, wherein the first step includes determining the first acceleration based on information indicating a relationship between the maximum acceleration of the stage and a positional fluctuation of the original to the stage, such that the positional fluctuation falls within an allowable range.

14. The method according to claim 13, wherein the first acceleration is determined further based on second information indicating the maximum acceleration of the stage and reproducibility of the positional fluctuation.

15. The method according to claim 1, wherein the first step includes scan-driving the stage in a predetermined direction so that a maximum acceleration is the first acceleration, and scan-driving the stage in an opposite direction to the predetermined direction so that a maximum acceleration is the first acceleration.

16. The method according to claim 1, wherein the first acceleration is set to 50% of the second acceleration.

17. The method according to claim 1, wherein the first acceleration is set to 40% of the second acceleration.

18. The method according to claim 1, wherein the first acceleration is determined among a plurality of acceleration candidates, based on a result of a positional fluctuation of the original to the stage obtained by scan-driving the stage for each of the plurality of acceleration candidates.

19. An exposure method of exposing a substrate via an original held by a stage while scanning the original, comprising:
performing a first step of scan-driving the stage without exposing the substrate so that a maximum acceleration is a first acceleration; and
performing a second step of scan-driving the stage while exposing the substrate, so that a maximum acceleration is a second acceleration, after the performing the first step,
wherein the first acceleration is lower than the second acceleration, and
wherein the number of times of scan-driving the stage in the first step is ten or less.

20. The method according to claim 19, wherein the number of times of scan- driving the stage in the first step is within a range from four times to ten times.

21. The method according to claim 19, wherein scan-driving the stage in each of the first step and the second step includes an acceleration operation and a deceleration operation, the acceleration operation having a constant acceleration period in which an acceleration of the stage is constant, and the deceleration operation having a constant deceleration period in which an deceleration of the stage is constant.

22. The method according to claim 19, wherein in the performing the first step, the stage is scan-driven with the same moving stroke as in the performing the second step.

23. An exposure apparatus for exposing a substrate via an original while scanning the original, comprising:
a stage configured to be movable while holding the original; and
a control unit configured to control performing a first step of scan-driving the stage without exposing the substrate so that a maximum acceleration is a first acceleration, and control performing a second step of scan-driving the stage while exposing the substrate, so that a maximum acceleration is a second acceleration, after the performing the first step,
wherein the first acceleration is lower than the second acceleration, and
wherein the number of times of scan-driving the stage in the first step is ten or less.

24. The exposure apparatus according to claim 23, wherein the number of times of scan-driving the stage in the first step is within a range from four times to ten times.

25. The exposure apparatus according to claim 23, wherein scan-driving the stage in each of the first step and the second step includes an acceleration operation and a deceleration operation, the acceleration operation having a constant acceleration period in which an acceleration of the stage is constant, and the deceleration operation having a constant deceleration period in which an deceleration of the stage is constant.

26. The exposure apparatus according to claim 23, wherein in the performing the first step, the stage is scan-driven with the same moving stroke as in the performing the second step.

27. A method of manufacturing an article, the method comprising:
exposing a substrate using an exposure method;
developing the exposed substrate; and
processing the developed substrate to manufacture the article,
wherein the exposure method exposes the substrate via an original held by a stage while scanning the original, and includes:
performing a first step of scan-driving the stage without exposing the substrate so that a maximum acceleration is a first acceleration; and
performing a second step of scan-driving the stage while exposing the substrate, so that a maximum acceleration is a second acceleration, after the performing the first step,
wherein the first acceleration is lower than the second acceleration, and
wherein the number of times of scan-driving the stage in the first step is ten or less.

* * * * *